US009891275B2

(12) United States Patent
Bickford et al.

(10) Patent No.: US 9,891,275 B2
(45) Date of Patent: Feb. 13, 2018

(54) INTEGRATED CIRCUIT CHIP RELIABILITY QUALIFICATION USING A SAMPLE-SPECIFIC EXPECTED FAIL RATE

(71) Applicant: International Business Machines Corporation, Armonk, NY (US)

(72) Inventors: Jeanne P. Bickford, Essex Junction, VT (US); Nazmul Habib, South Burlington, VT (US); Baozhen Li, South Burlington, VT (US); Tad J. Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 14/748,704

(22) Filed: Jun. 24, 2015

(65) Prior Publication Data
US 2016/0377674 A1    Dec. 29, 2016

(51) Int. Cl.
G01R 31/28    (2006.01)
G05B 19/418    (2006.01)
G01R 31/26    (2014.01)

(52) U.S. Cl.
CPC ..... *G01R 31/2894* (2013.01); *G05B 19/4188* (2013.01); *G01R 31/2642* (2013.01);
(Continued)

(58) Field of Classification Search
CPC ............ G01R 31/2894; G01R 31/2642; G05B 19/4188; G05B 2219/45031; G05B 2219/49034; Y02P 90/02
See application file for complete search history.

(56) References Cited

U.S. PATENT DOCUMENTS 6,393,602 B1    5/2002 Atchison et al.
6,789,032 B2    9/2004 Barbour et al.
(Continued)

FOREIGN PATENT DOCUMENTS

CN     102567560 A    7/2012
JP     2011-077287    4/2011
(Continued)

OTHER PUBLICATIONS

Hsu et al., "Hybrid Data Mining Approach for Pattern Extraction From Wafer Bin Map to Improve Yield in Semiconductor Manufacturing", ScienceDirect, International J. Production Economics, 107 (2007), pp. 88-103.
(Continued)

*Primary Examiner* — Carlos Ortiz Rodriguez
(74) *Attorney, Agent, or Firm* — Gibb & Riley, LLC; Steven J. Meyers

(57) ABSTRACT

Disclosed is a method for performing reliability qualification of manufactured integrated circuit (IC) chips. In the method, IC chips are manufactured according to a design and sorted into groups, which correspond to different process windows within a process distribution for the design. Group fail rates are determined for the groups. Reliability qualification of the manufactured IC chips is performed. Specifically, a sample of the IC chips is stress tested and the manufactured IC chips are qualified if the actual fail rate of the sample is no greater than an expected fail rate. The expected fail rate used is not, however, the expected overall fail rate for all the manufactured IC chips. Instead it is a unique expected fail rate for the specific sample itself and it is determined considering fail rate contributions from only those specific groups of IC chips from which the IC chips in the sample were selected.

20 Claims, 5 Drawing Sheets

(52) U.S. Cl.
CPC .............. *G05B 2219/45031* (2013.01); *G05B 2219/49034* (2013.01)

(56) References Cited

U.S. PATENT DOCUMENTS

| | | |
|---|---|---|
| 8,799,831 B2 | 8/2014 | Nehmadi et al. |
| 8,943,444 B2 | 1/2015 | Bickford et al. |
| 2002/0143483 A1 | 10/2002 | Ono et al. |
| 2006/0217910 A1 | 9/2006 | Wang |
| 2007/0156379 A1 | 7/2007 | Kulkarni et al. |
| 2007/0212798 A1 | 9/2007 | Deshmukh et al. |
| 2008/0114558 A1 | 5/2008 | Erez et al. |
| 2008/0295047 A1 | 11/2008 | Nehmadi et al. |
| 2011/0251812 A1 | 10/2011 | Gurov et al. |
| 2012/0191384 A1 | 7/2012 | Kalgren et al. |

FOREIGN PATENT DOCUMENTS

| | | |
|---|---|---|
| WO | 2006133233 A3 | 12/2006 |
| WO | 2007120279 A2 | 10/2007 |

OTHER PUBLICATIONS

Lee et al., "IC Performance Prediction for Test Cost Reduction", Semiconductor Manufacturing Conference Proceedings, IEEE,1999, pp. 111-114.

Turakhia et al., "Bridging DFM Analysis and Volume Diagnostics for Yield Learning—A Case Study", 27th IEEE VLSI Test Symposium, 2009, pp. 167-172.

| Group Number | % of IC Chips |
|---|---|
| 15 | 0.298 |
| 14 | 0.789 |
| 13 | 1.817 |
| 12 | 3.641 |
| 11 | 6.349 |
| 10 | 9.633 |
| 9 | 12.720 |
| 8 | 14.617 |
| 7 | 14.617 |
| 6 | 12.720 |
| 5 | 9.633 |
| 4 | 6.349 |
| 3 | 3.641 |
| 2 | 1.817 |
| 1 | 0.789 |
| 0 | 0.298 |

FIG. 3B

INTEGRATED CIRCUIT CHIP RELIABILITY QUALIFICATION USING A SAMPLE-SPECIFIC EXPECTED FAIL RATE

BACKGROUND

The present invention relates to integrated circuit (IC) chip reliability and, more particularly, to a method for performing reliability qualification of manufactured integrated circuit (IC) chips using a process window-aware sample-specific expected fail rate, which accounts for the fact that failure mechanisms that impact IC chip reliability may be process window-dependent.

Various failure mechanisms can cause the components (e.g., devices, interconnects, etc.) of an integrated circuit (IC) chip to degrade. These failure mechanisms include, but are not limited to, time-dependent dielectric breakdown (TDDB) of the gate dielectric layer or between metal lines, hot carrier injection (HCI), negative bias temperature instability (NBTI), positive bias temperature instability (PBTI), soft error rate (SER), retention disturbance, stress migration (SM) (also referred to as stress-induced voiding (SIV)) and electromigration (EM). Over time these failure mechanisms can impact performance (e.g., operating speed) and/or lead to IC chip failure.

In order to ensure that manufactured IC chips will meet reliability specifications despite these failure mechanisms, reliability qualification is performed prior to shipping out the manufactured IC chips and/or incorporating them into products. Specifically, during reliability qualification, a sample of the manufactured IC chips is stress tested to determine whether the sample meets reliability specifications and, particularly, whether the sample has a fail rate that is no greater than an expected overall fail rate for all of the manufactured IC chips. If the actual fail rate for the sample is less than or equal to the expected overall fail rate, the manufactured IC chips can be shipped and/or incorporated into products. However, if the actual fail rate for the sample is higher than the expected overall fail rate for the manufactured IC chips, the manufactured IC chips may have to be scrapped or recycled (i.e., not shipped or incorporated into products, as planned) and instead design changes and/or process changes may need to be developed. Errors during reliability qualification can lead to unreliable IC chips being shipped and/or incorporated into products and reliable IC chips being scrapped or recycled. Thus, accurate techniques for performing reliability qualification are needed.

SUMMARY

In view of the foregoing, disclosed is a method for performing reliability qualification of manufactured integrated circuit (IC) chips using a process window-aware sample-specific expected fail rate. Specifically, IC chips can be manufactured according to a design and sorted into groups corresponding to different process windows within a process distribution for the design. Group fail rates can be set for each group based on failure mechanism fail rates, which are set for multiple different failure mechanisms. A sample of manufactured IC chips can be selected from one or more of the groups and can be stress tested. If the actual fail rate of the sample is no greater than an expected fail rate, the manufactured IC chips can be qualified (e.g., approved for shipping and/or incorporation into a product). The expected fail rate used is not, however, the expected overall fail rate for all the manufactured IC chips in the process distribution. Instead, it is a unique fail rate, which is specific to the sample itself (i.e., an expected sample fail rate) and which can be determined considering fail rate contributions from only those specific group(s) of IC chips from which the sample was selected. Since the specific group(s) correspond to specific process window(s) within the process distribution for the design and since those specific group(s) can have varying group fail rates, the expected sample fail rate accounts for the fact that the failure mechanisms that impact IC chip reliability may be process window-dependent. By using this expected sample fail rate, as opposed to the expected overall fail rate for all the manufactured IC chips, the method avoids qualification errors (e.g., qualifying the manufactured IC chips when the majority of the sample was taken from a group having a group fail rate that is lower than the expected overall fail rate or disqualifying the manufactured IC chips when the majority of the sample was taken from a group having a group fail rate that is higher than the expected overall fail rate).

More particularly, one embodiment of the method can comprise manufacturing IC chips according to a design. Then, those manufactured IC chips can be sorted into groups, which correspond to different process windows within a process distribution for the design. Subsequently, reliability qualification of the manufactured IC chips can be performed. Specifically, pass/fail criteria can be set for the manufactured IC chips. Given the pass/fail criteria, group fail rates can be determined for the groups of IC chips. A sample of the manufactured IC chips can be selected from at least one of the groups of manufactured IC chips. All of the specific group(s) from which the sample was selected can be identified. Once these specific groups are identified, the percentages of the sample selected from each of those specific groups and the specific group fail rates for each of those specific groups can be determined. Based on the percentages and the specific group fail rates, an expected sample fail rate can be determined. Additionally, stress testing of the sample can be performed in order to determine an actual sample fail rate for the sample (e.g., given the pass/fail criteria). The expected sample fail rate can then be compared to the actual sample fail rate in order to decide whether to qualify the manufactured IC chips (e.g., for shipping or incorporation into a product) or to disqualify the manufactured IC chips (e.g., to scrap or recycle the manufactured IC chips).

Another embodiment of the method disclosed herein can similarly comprise manufacturing IC chips according to a design. Then, those manufactured IC chips can be sorted into groups, which correspond to different process windows within a process distribution for the design. Subsequently, reliability qualification of the manufactured IC chips can be performed. Specifically, pass/fail criteria can be set for the manufactured IC chips. Given the pass/fail criteria, group fail rates can be determined for the groups of IC chips and an expected overall fail rate can be determined for all of the manufactured IC chips. A sample of the manufactured IC chips can be selected from at least one of the groups of manufactured IC chips. All of the specific group(s) from which the sample was selected can be identified. Once the specific groups are identified, the percentages of the sample selected from each of those specific groups and the specific group fail rates for each of those specific groups can be determined. Based on the percentages and the specific group fail rates, an expected sample fail rate, which is different from the expected overall fail rate, can be determined. Additionally, stress testing of the sample can be performed in order to determine an actual sample fail rate for the sample (e.g., given the pass/fail criteria). The expected sample fail rate can then be compared to the actual sample fail rate in order to decide whether to qualify the manufactured IC chips (e.g., for shipping or incorporation into a product) or to disqualify the manufactured IC chips (e.g., to scrap or recycle the manufactured IC chips).

Another embodiment of the method disclosed herein can similarly comprise manufacturing IC chips according to a design. Then, those manufactured IC chips can be sorted into groups, which correspond to different process windows within a process distribution for the design. Subsequently, reliability qualification of the manufactured IC chips can be performed. During reliability qualification, pass/fail criteria can be set for the manufactured IC chips. Given the pass/fail criteria, group fail rates can be determined for the groups of IC chips and an expected overall fail rate can be determined for all of the manufactured IC chips. A sample of the manufactured IC chips can be selected from at least one of the groups of manufactured IC chips. All of the specific group(s) from which the sample was selected can be identified. Once the specific groups are identified, the percentages of the sample selected from each of those specific groups and the specific group fail rates for each of those specific groups can be determined. Based on the percentages and the specific group fail rates, an expected sample fail rate, which is different from the expected overall fail rate, can be determined. Specifically, the expected sample fail rate can be calculated as the sum of fail rate contributions from each of the specific groups, wherein each fail rate contribution of each specific group comprise the product of the specific group fail rate determined for the specific group multiplied by the percentage of the sample selected from that specific group. Additionally, stress testing of the sample can be performed in order to determine an actual sample fail rate for the sample (e.g., given the pass/fail criteria). The expected sample fail rate can then be compared to the actual sample fail rate in order to decide whether to qualify the manufactured IC chips (e.g., for shipping or incorporation into a product) or to disqualify the manufactured IC chips (e.g., to scrap the manufactured IC chips).

BRIEF DESCRIPTION OF THE SEVERAL VIEWS OF THE DRAWINGS

The present invention will be better understood from the following detailed description with reference to the drawings, which are not necessarily drawn to scale and in which:

FIG. 3B is a table illustrating groups of IC chips and the percentages of the IC chips in each of the groups, when the process distribution is a Gaussian distribution as in FIG. 3A;

DETAILED DESCRIPTION

Figure 1:
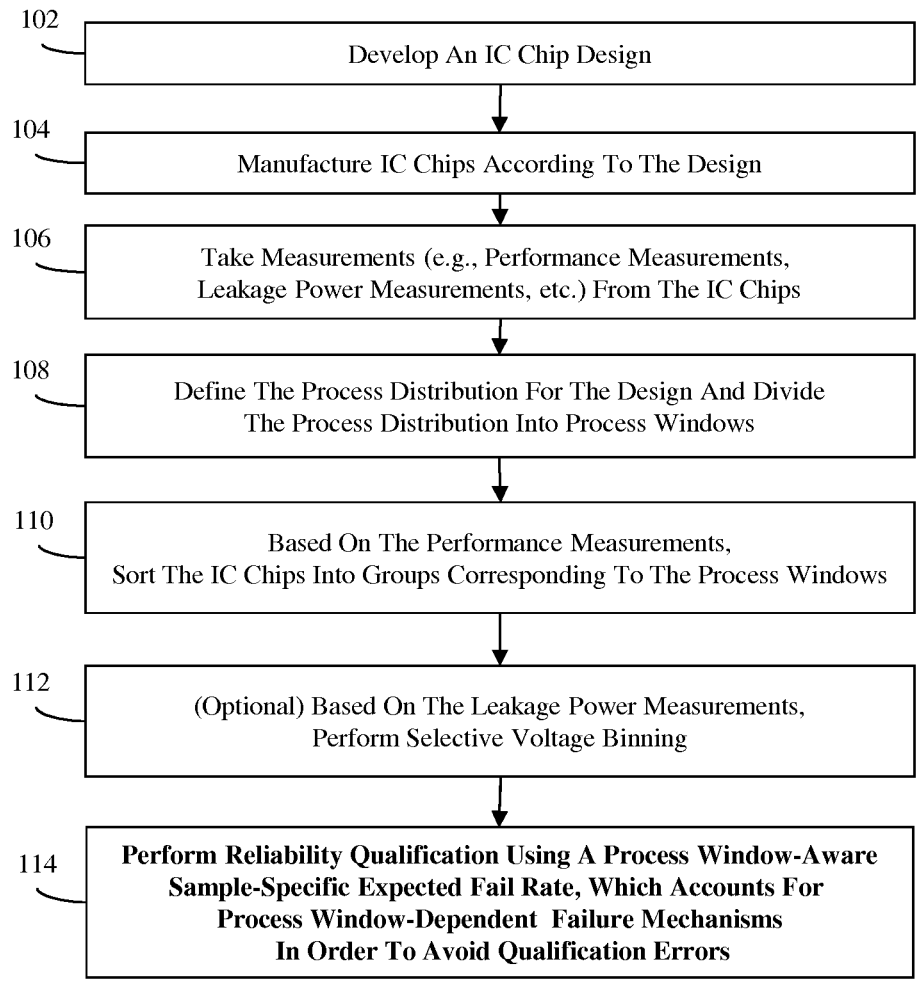
FIG. 1 is a flow diagram illustrating a method for performing reliability qualification of manufactured integrated circuit (IC) chips using a process window-aware sample-specific expected fail rate.

As mentioned above, various failure mechanisms can cause the components (e.g., devices, interconnects, etc.) of an integrated circuit (IC) chip to degrade. These failure mechanisms include, but are not limited to, time-dependent dielectric breakdown (TDDB) of the gate dielectric layer or between metal lines, hot carrier injection (HCI), negative bias temperature instability (NBTI), positive bias temperature instability (PBTI), soft error rate (SER), retention disturbance, stress migration (SM) (also referred to as stress-induced voiding (SIV)) and electromigration (EM). Over time these failure mechanisms can impact performance (e.g., operating speed) and/or lead to IC chip failure.

Reliability of an IC chip (also referred to herein as the expected useful life of the IC chip) can be defined in terms of the expected minimum amount of time or, more particularly, the expected minimum number of power-on hours (POHs) during which an IC chip can be expected, with a specified probability, to perform without fail. Reliability is typically determined as a function of various failure mechanisms. Specifically, designers have realized that process parameter variations have a significant impact on IC chip performance (e.g., on operating speed, as indicated by delay). Such process parameter variations are due to variations that occur during manufacturing and include, but are not limited to, variations in channel length, channel width, doping, spacer width, etc. To determine reliability, reliability simulators model the various failure mechanisms in order to determine the fail rates associated with those failure mechanisms across the full process distribution for the design. The full process distribution for the design refers to the performance range of IC chips manufactured according to the design, given a nominal operating voltage. This performance range extends from relatively fast IC chips (e.g., 3σ fast IC chips) at one end of the process distribution (i.e., the "fast" end of the process distribution) to relatively slow IC chips (e.g., 3σ slow IC chips) at the opposite end of the process distribution (i.e., the "slow" end of the process distribution).

Reliability qualification refers to a process wherein, following manufacture of IC chips according to a given design, a sample of the manufactured IC chips can be selected and subjected to qualification testing (i.e., accelerated stress testing) to determine if the actual fail rate of the sample is less than or equal to the expected overall fail rate. Specifically, during qualification testing, the IC chips in the sample can be exercised to simulate field conditions. That is, the IC chips in the sample can be operated at an elevated temperature and/or at an elevated voltage for a predefined period of time. The actual fail rate of the sample can then be compared to the expected overall fail rate for all the manufactured IC chips and, if the actual fail rate for the sample is less than or equal to the expected overall fail rate for the manufactured IC chips, the manufactured IC chips can be shipped and/or incorporated into products. However, if the actual fail rate for the sample is higher than the expected overall fail rate for the manufactured IC chips, the manufactured IC chips may have to be scrapped (i.e., not shipped or incorporated into products as planned) and instead design changes and/or process changes may need to be developed. Errors during reliability qualification can lead to unreliable IC chips being shipped and/or incorporated into products and reliable IC chips being scrapped. Thus, accurate techniques for performing reliability qualification are needed.

In view of the foregoing, disclosed is a method for performing reliability qualification of manufactured integrated circuit (IC) chips using a process window-aware sample-specific expected fail rate. Specifically, IC chips can be manufactured according to a design and sorted into groups corresponding to different process windows within a process distribution for the design. Group fail rates can be set for each group based on failure mechanism fail rates, which are set for multiple different failure mechanisms. A sample of manufactured IC chips can be selected from one or more of the groups and can be stress tested. If the actual fail rate of the sample is no greater than an expected fail rate, the manufactured IC chips can be qualified (e.g., approved for shipping and/or incorporation into a product). The expected fail rate used is not, however, the expected overall fail rate for all the manufactured IC chips in the process distribution. Instead, it is a unique fail rate, which is specific to the sample itself (i.e., an expected sample fail rate) and which can be determined considering fail rate contributions from only those specific groups of IC chips from which the sample was selected. Since the specific group(s) correspond to specific process window(s) within the process distribution for the design and since those specific group(s) can have varying group fail rates, the expected sample fail rate accounts for the fact that the failure mechanisms that impact IC chip reliability may be process window-dependent. By using this expected sample fail rate, as opposed to the expected overall fail rate for all the manufactured IC chips, the method avoids qualification errors (e.g., qualifying the manufactured IC chips when the majority of the sample was taken from a group having a group fail rate that is lower than the expected overall fail rate or disqualifying the manufactured IC chips when the majority of the sample was taken from a group having a group fail rate that is higher than the expected overall fail rate).

More particularly, referring to the flow diagram of FIG. 1, disclosed is a method for performing reliability qualification of manufactured integrated circuit (IC) chips using a process window-aware sample-specific expected fail rate, which accounts for the fact that the failure mechanisms that impact IC chip reliability may be process window-dependent.

In each of these methods, a design for an integrated circuit (IC) chip (102) is developed and a total number (N) of IC chips are manufactured according to that design (104). Those skilled in the art will recognize that the IC chip design developed at process 102 will set out specifications for various parameters (e.g., for channel length, channel width, doping, spacer width, etc.). However, the actual values of those parameters may vary due to manufacturing process variations and, as a result, may impact the performance (e.g., operating speed, as indicated by delay) of manufactured IC chips.

Following IC chip manufacture at process 104, various different measurements can be taken from the manufactured IC chips (106). These measurements can include, but are not limited to, performance measurements (e.g., delay measurements). Various different techniques for measuring performance are well known in the art. Thus, the details of such techniques are omitted from this specification in order to allow the reader to focus on the salient aspects of the disclosed methods.

Additionally, the method can comprise defining the process distribution of the IC chip design and dividing that process distribution into multiple process windows (108). That is, given the condition that all IC chips are operated using the same supply voltage, the full performance range (i.e., the full process distribution) of the IC chip design can be defined from the fastest IC chips (e.g., from 3-sigma fast IC chips) relative to IC chips with a nominal operating speed to the slowest IC chips (e.g., −3-sigma slow IC chips) relative to IC chips with the nominal operating speed. This process distribution can, for example, be a Gaussian distribution. Alternatively, the process distribution can be some other statistical distribution. In any case, the process distribution for the IC design can be defined either prior to manufacturing the IC chips at process 104 (e.g., based on a best case/worst case analysis) or after manufacturing the IC chips at process 104 (e.g., based on the actual performance measurements taken from the manufactured IC chips at process 106). In any case, the process distribution can be divided into some number (M) of process windows.

Figure 2:
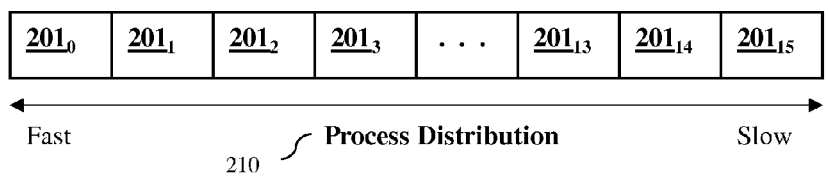
FIG. 2 is drawing illustrating sorting of IC chips into groups corresponding to process windows within a process distribution.

The manufactured IC chips can, based on the performance measurements acquired at process 106, be sorted into groups (e.g., M groups) that correspond to the various process windows within the process distribution (110). Thus, each group will contain a subset of the total number (N) of manufactured IC chips. As illustrated in FIG. 2, the process distribution 210 can be divided at process 108 into process windows or, more particularly, successive intervals from the slow end of the process distribution to the fast end of the process distribution. The IC chips can be sorted into groups $201_0$-$201_{15}$ (also referred to herein as bins) at process 110 that correspond to those process windows. For illustration purposes, FIG. 2 shows that the IC chips can be sorted into sixteen groups $201_0$-$201_{15}$, which correspond to sixteen process windows (i.e., sixteen successive intervals across the process distribution 210), respectively. The first group $201_0$ corresponds to the process window with the fastest IC chips in the process distribution 210 and the last group $201_{15}$ corresponds to the process window with the slowest IC chips in the process distribution 210.

Figure 3A:
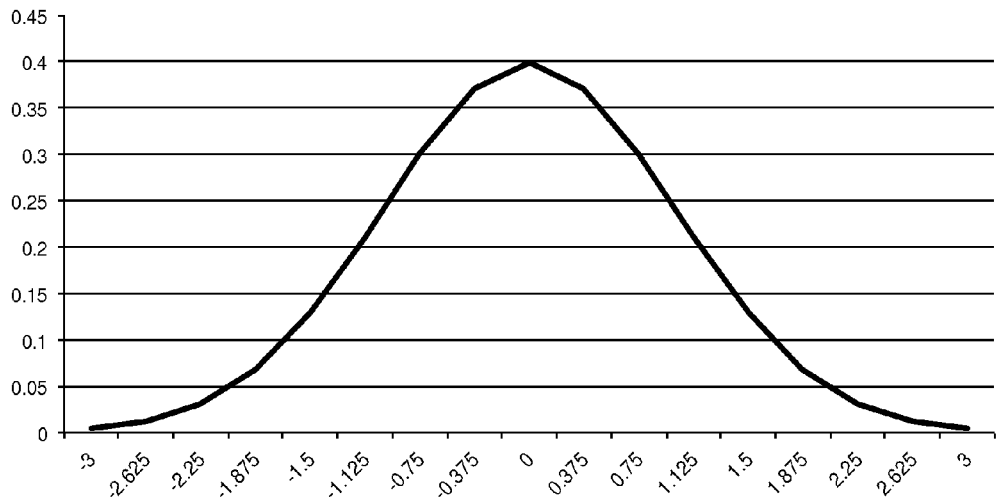
FIG. 3A is a graph illustrating an exemplary process distribution that is a Gaussian distribution.

It should be understood that the percentages of the N manufactured IC chips that are sorted into each of the M groups (and, thereby the actual number (n) of IC chips in each of the groups, where the value of n may vary from group to group) will depend on the type of distribution, on the number (M) of process windows and on whether there is uniformity across the process windows (e.g., whether each process window encompasses the same number of units sigma). For example, for a process distribution 210 that is a Gaussian distribution as illustrated in the graph of FIG. 3A and that is sorted into sixteen different essentially uniform process windows (i.e., the process windows each encompass the same number of units sigma), the percentages of the N manufactured IC chips that are sorted into the sixteen different groups $201_0$-$201_{15}$ that correspond to the sixteen process windows, respectively, can be set as shown in the table of FIG. 3B. However, if the process distribution 210 is a statistical distribution other than a Gaussian distribution, the number of process windows (and thereby the number of groups) may differ and/or the number of units sigma per process window may differ from process window to process window such that these percentages may also differ.

Various different processes can be performed with respect to these groups, which correspond to the different process windows.

For example, optionally, once the manufactured IC chips are sorted into the groups $201_0$-$201_{15}$ at process 110, power-optimized selective voltage binning can be performed (112). That is, group-specific operating voltage ranges can be assigned to the different groups $201_0$-$201_{15}$ based on the leakage power measurements acquired at process 106 in order to minimize power consumption of the IC chips within the groups $201_0$-$201_{15}$ and, thereby minimize power consumption of the IC chips across the full process distribution 210. Various different techniques for defining the process distribution of an IC chip design, for dividing that process distribution into process windows, for sorting IC chips into groups corresponding to process windows and for assigning operating voltage ranges to the groups, as described above, are well known in the art and, thus, the details of such techniques are omitted from this specification in order to allow the reader to focus on the salient aspects of the disclosed method.

Additionally, reliability qualification of the manufactured IC chips can be performed using a sample-specific expected fail rate, which accounts for the fact that the failure mechanisms that impact IC chip reliability may be process window-dependent (114).

Figure 4:
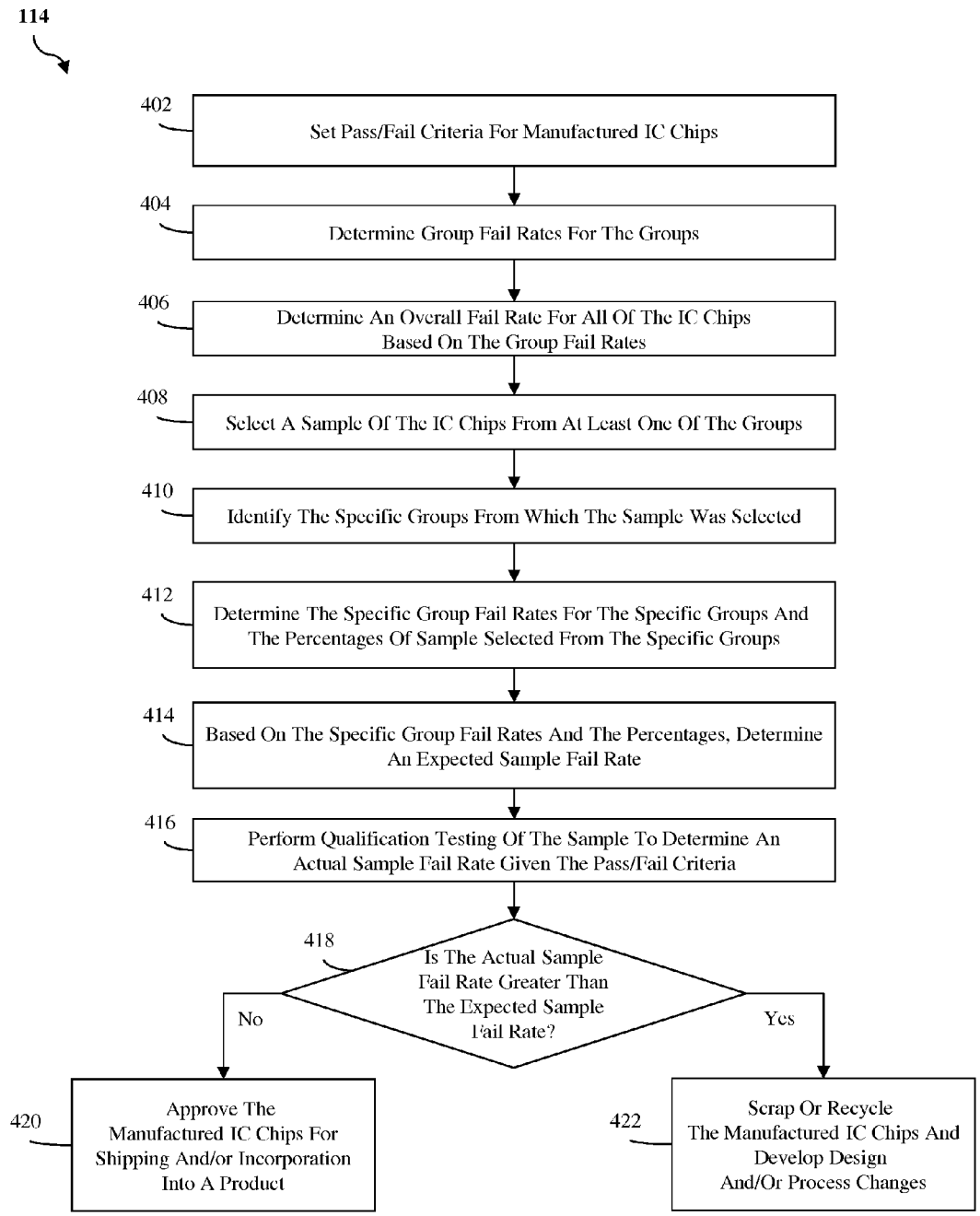
FIG. 4 is a flow diagram further illustrating process 114 of FIG. 1.

Specifically, as described in the flow diagram of FIG. 4, this reliability qualification process 114 can comprise setting pass/fail criteria for the manufactured IC chips (402). The pass/fail criteria can include, but is not limited to, required functional responses and/or required parametric measurements. Required functional responses can comprise, for example, expected data output in response to known data input. Required parametric measurements can comprise, for example, voltage measurements (e.g., minimum operating voltage (Vmin), saturation threshold voltage (Vtsat), linear threshold voltage (Vtlin), etc.), current measurements (e.g., off current (Ioff), on-current (Ion), linear drain current (Idlin), etc.), timing measurements (e.g., maximum frequency (Fmax), switching speed, signal propagation delay, etc.), resistance measurements and capacitance measurements.

Given the pass/fail criteria, group fail rates can be determined for the groups $201_0$-$201_{15}$, respectively (404). Specifically, as mentioned, various different failure mechanisms impact reliability. These different failure mechanisms can include, but are not limited to, hot carrier injection (HCI), negative bias temperature instability (NBTI), positive bias temperature instability (PBTI), soft error rate (SER), retention disturbance, stress migration (SM) (also referred to as stress-induced voiding (SIV)) and electromigration (EM). As illustrated in U.S. Pat. No. 8,943,444 of Bickford et al., issued on Jan. 27, 2015 and incorporated herein by reference, depending upon the failure mechanism at issue, the failure mechanism fail rate for any of these failure mechanisms may not be constant across the full process distribution. Specifically, when a specific failure mechanism is modeled separately for different process windows within the full process distribution, the resulting fail rates may or may not differ for the different process windows. That is, the fail rate for a specific failure mechanism in a process window at the fast end of the process distribution may be higher than, lower than or the same as the fail rate for the same failure mechanism in a process window at the slow end of the process distribution. For example, the BTI and HCI failure mechanisms have a higher fail rate at the slow end of the process distribution, the TDDB and EM failure mechanisms have a higher fail rate at the fast end of the process distribution, and other failure mechanisms (e.g., stress-induced voiding (SIV)) have an essentially constant fail rate across the process distribution.

At process 404, the group fail rate for each particular group, which corresponds to a particular process window, can be determined. Specifically, each group fail rate for each particular group can be determined based on the chip fail rates of the IC chips within that particular group. Each chip fail rate for each particular IC chip within the particular group can be determined based on failure mechanism fail rates determined for multiple different failure mechanisms, respectively, as exhibited on that particular IC chip within that particular group. Those skilled in the art will recognize that a reliability simulator can be used to determine the failure mechanism fail rates. That is, for each particular IC chip contained in a particular group, a reliability simulator can generate models of the different failure mechanisms at issue on the particular chip as a function of the particular process window, which is associated with that particular group.

More specifically, based on models generated by a reliability simulator, failure mechanism fail rates associated with different failure mechanisms on a particular chip within a particular group can be determined. Then, the chip fail rate for that particular chip within that particular group that corresponds to a particular process window can be calculated using the following expression:

$$F_i = 1 - \Pi_k(1-f_k), \quad (1)$$

where $F_i$ represents the chip fail rate of one of the integrated circuit chips (i) in one of the groups (j) as a function of the a selected voltage, temperature and/or frequency for that group j, where $f_k$ represents one of the individual failure mechanism fail rates (i.e., the fail rate associated with a single one of the failure mechanisms (k) as a function of the selected voltage, temperature ad/or frequency) and where $\Pi_k(1-f_k)$ represents the Cartesian product of $1-f_k$ for all of the different failure mechanisms at issue (e.g., $(1-f_{TDDB})*(1-f_{HCI})*(1-f_{NBTI})* \ldots *(1-f_{SM})*(1-f_{EM})$). Equation (1) can further be used to find the chip fail rates for all of the IC chips in that particular group in the same manner as described above.

Once the chip fail rates for all of the IC chips in the particular group are acquired as described above, the group fail rate for that particular group can be determined using the following expression:

$$F_j = \frac{1}{n}\sum_i F_i, \quad (2)$$

where $F_j$ represents the group fail rate of a group as a function of the selected voltage, temperature and/or frequency for that group j, n represents the number of IC chips within that group, and where $\Sigma_i F_i$ represents the sum of all the chip fail rates $F_i$ for all of the integrated circuit chips (i) within the group. Equations (1) and (2) can further be used at process 404 to find the group fail rates for all of the groups that correspond to all of the process windows within the process distribution in the same manner as described above.

Once the group fail rates for all of the groups corresponding to all of the process windows in the process distribution are determined as described above, the expected overall fail rate for the full process distribution (i.e., for all of the IC chips) can be calculated (406) using, for example, the following expression:

$$F_{PD} = \Sigma_j(p_j * F_j), \quad (3)$$

where $F_{PD}$ represents the expected process distribution fail rate (i.e., the expected overall fail rate for all of the manufactured IC chips), where $p_j$ represents the percentage of the total number (N) of IC chips within a particular group and $p_j*F_j$ represents the contribution of the group fail rate of the particular group to the overall fail rate of the process distribution and where $\Sigma_j(p_j*F_j)$ is the sum of those contributions.

A qualification sample of the manufactured IC chips (i.e., a small portion of the manufactured IC chips) can be selected from at least one of the groups of manufactured IC chips (408). It should be noted that reliability qualification typically requires IC chips in the qualification sample be selected randomly with the goal being that the IC chips contained in the qualification sample represent the full process distribution. However, since the method disclosed herein uses a sample-specific expected fail rate, random selection and/or selection of IC chips across the full process distribution is not required. That is, the sample can be a non-random sample and can be selected from less than all of the groups. In any case, the sample can comprise some number X of manufactured IC chips, which is less than the total number N of the manufactured IC chips. This method enables qualification to assess the entire process window even when a particular lot or series of lots from which a sample is to be taken does not contain valid samples from across the entire process distribution.

Once the sample is selected, all of the specific group(s) from which the sample was selected can be identified (410). Then, the percentages of the sample selected from each of those specific groups and the specific group fail rates for each of those specific groups can be determined (412). That is, for each specific group, the previously acquired group fail rate can be noted. Additionally, for each specific group, the number x of IC chips from the sample that is/are contained in the specific group can be determined and divided by the number X of IC chips in the sample, thereby determining the percentage of the sample of IC chips that was selected from that specific group.

Based on the percentages and the specific group fail rates determined at process 412, an expected sample fail rate can be determined (414). Specifically, the expected sample fail rate can be calculated as the sum of fail rate contributions from each of the specific groups, wherein each fail rate contribution of each specific group comprise the product of the specific group fail rate determined for the specific group multiplied by the percentage of the sample selected from that specific group. That is, the expected sample fail rate can be calculated using the following expression:

$$F_S = \Sigma_y(p_y * F_y), \quad (4)$$

where $F_S$ represents the expected sample fail rate (i.e., the expected fail rate for all the IC chips in the sample), where $p_y$ represents the percentage of the number X of IC chips selected for the sample from a specific group and $p_y * F_y$ represents the contribution of the specific group fail rate of the specific group to the expected sample fail rate and where $\Sigma_y(p_y * F_y)$ is the sum of the contributions from all of the specific groups from which the sample was selected. It should be noted that, for those of the groups from which no IC chips was selected for the sample, the value of p would be 0 (i.e., 0/X) and, thus, such groups would not contribute to the expected sample fail rate. It should further be noted that, since the group fail rates vary from group to group and since the contribution of any group fail rate to the expected sample fail rate is dependent upon the percentage of the sample selected from that group, the expected sample fail rate will typically be different from expected overall fail rate for all the IC chips and will also typically be different from each group fail rate unless all of the IC chips in the sample are selected from the same group.

Qualification testing (i.e., accelerated tress testing) of the sample of IC chips can subsequently be performed in order to determine an actual sample fail rate for the sample (e.g., given the pass/fail criteria) (416). As mentioned above, the pass/fail criteria for the manufactured IC chips can include, but is not limited to, required functional responses and/or required parametric measurements. During qualification testing, the IC chips in the sample can be exercised to simulate field conditions. That is, the IC chips in the sample can be operated at an elevated temperature and/or at an elevated voltage for a predefined period of time. They can subsequently be tested to determine the functional responses and/or parametric measurements, as necessary. Various different testing structures, systems and methods are well known in the art for acquiring functional responses and/or parametric measurements from IC chips and, thus, the details of such testing structures, systems and methods are omitted from this specification in order to allow reader to focus on the salient aspects of the disclosed method. In any case, these testing structures, systems and/or methods can be used to determine the fail rate of the IC chips within the sample (i.e., the actual sample fail rate) given the previously set pass/fail criteria.

The expected sample fail rate determined at process 414 can then be compared to the actual sample fail rate acquired at process 416 in order to decide whether to qualify the manufactured IC chips or to disqualify the manufactured IC chips (418). Specifically, if the actual sample fail rate is less than or equal to the expected sample fail rate, the manufactured IC chips can be qualified or, more specifically, approved for shipping and/or approved for incorporation into a product (420). However, if the actual sample fail rate is greater than the expected sample fail rate, the manufactured IC chips may be disqualified or, more specifically, scrapped or recycled (422). Furthermore, if the manufactured IC chips are disqualified, additional processing can be performed. For example, design changes and/or process changes can be developed (e.g., proposed, evaluated and, if appropriate, implemented) in order improve the reliability of subsequently manufactured IC chips.

The method as described above can be used in the fabrication of IC chips (e.g., IC chips the above-described programmable bits). The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the disclosed methods (e.g., processes used when defining the process distribution, dividing the process distribution, determining group fail rates, determining the overall fail rate, selecting the sample, determining the expected sample fail rate, controlling qualification testing of the sample, etc.) can be implemented using a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-determining data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
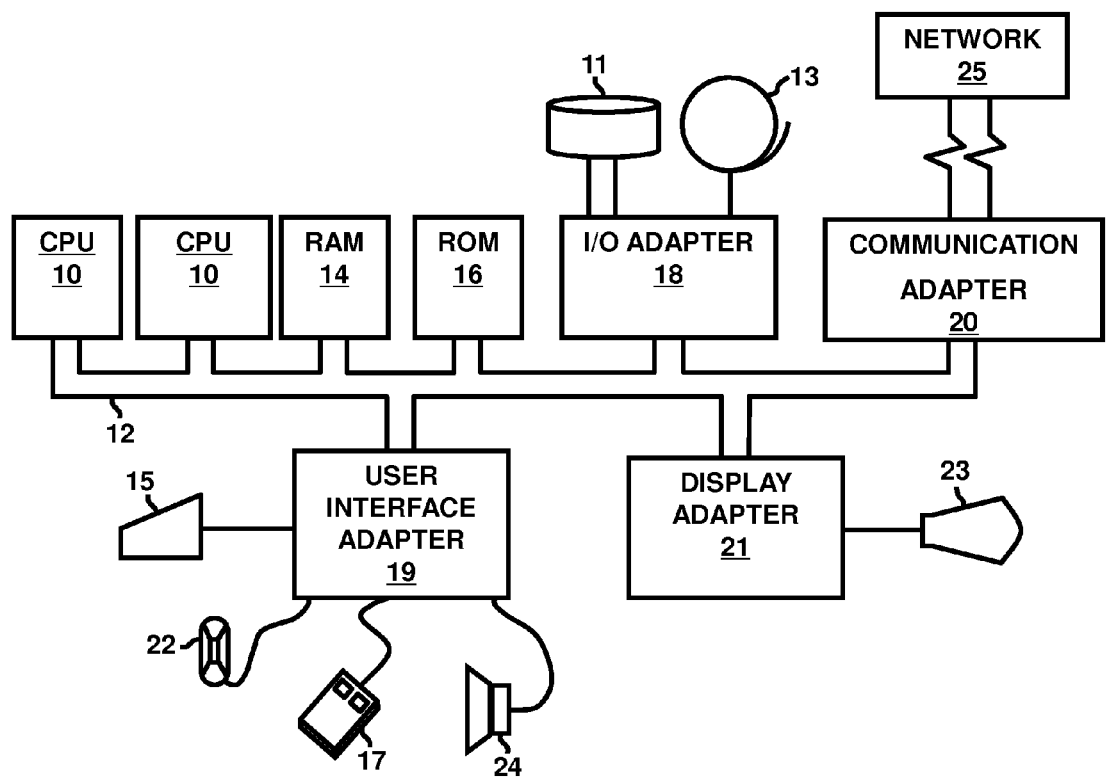
FIG. 5 is a schematic diagram illustrating an exemplary computer system for implementing aspects of the disclosed method.

A representative hardware environment (i.e., a computer system) for implementing aspects of the methods, as described above, is depicted in FIG. 5. This schematic drawing illustrates a hardware configuration of an information handling/computer system in accordance with the embodiments herein. The system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network

25, and a display adapter 21 connects the bus 12 to a display device 23 which may be embodied as an output device such as a monitor, printer, or transmitter, for example.

It should be understood that the terminology used herein is for the purpose of describing the disclosed methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

Therefore, disclosed above is a method for performing reliability qualification of manufactured integrated circuit (IC) chips using a process window-aware sample-specific expected fail rate. Specifically, IC chips can be manufactured according to a design and sorted into groups corresponding to different process windows within a process distribution for the design. Group fail rates can be set for each group based on failure mechanism fail rates, which are set for multiple different failure mechanisms. A sample of manufactured IC chips can be selected from one or more of the groups and can be stress tested. If the actual fail rate of the sample is no greater than an expected fail rate, the manufactured IC chips can be qualified (e.g., approved for shipping and/or incorporation into a product). The expected fail rate used is not, however, the expected overall fail rate for all the manufactured IC chips in the process distribution. Instead, it is a unique fail rate, which is specific to the sample itself (i.e., an expected sample fail rate) and which can be determined considering fail rate contributions from only those specific groups of IC chips from which the sample was selected. Since the specific group(s) correspond to specific process window(s) within the process distribution for the design and since those specific group(s) can have varying group fail rates, the expected sample fail rate accounts for the fact that the failure mechanisms that impact IC chip reliability may be process window-dependent. By using this expected sample fail rate, as opposed to the expected overall fail rate for all the manufactured IC chips, the method avoids qualification errors (e.g., qualifying the manufactured IC chips when the majority of the sample was taken from a group having a group fail rate that is lower than the expected overall fail rate or disqualifying the manufactured IC chips when the majority of the sample was taken from a group having a group fail rate that is higher than the expected overall fail rate).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    sorting integrated circuit chips manufactured according to a design into groups of integrated circuit chips, said groups corresponding to different process windows within a process distribution for said design; and,
    performing reliability qualification of said integrated circuit chips, said performing of said reliability qualification comprising:
        setting pass/fail criteria for said integrated circuit chips;
        given said pass/fail criteria, determining group fail rates for said groups;
        selecting a sample of said integrated circuit chips from at least one of said groups;
        identifying all specific groups from which said sample was selected;
        determining percentages of said sample selected from said specific groups and specific group fail rates for said specific groups;
        determining an expected sample fail rate for said sample, said expected sample fail rate being determined considering said percentages and said specific group fail rates;
        stress testing said sample to determine an actual sample fail rate for said sample, given said pass/fail criteria, said pass/fail criteria comprising pass or fail criteria indicating any of required functional responses for passing said stress testing and required parametric measurements required for passing said stress testing; and,
        comparing said expected sample fail rate to said actual sample fail rate.

2. The method of claim 1, further comprising: for each integrated circuit chip in each group, determining failure mechanism fail rates for different failure mechanisms on said integrated circuit chip as a function of a process window associated with said group and determining a chip fail rate based on said failure mechanism fail rates, each group fail rate being determined based on chip fail rates for any of said integrated circuit chips in said group.

3. The method of claim 1, said sample being selected from less than all of said groups.

4. The method of claim 1, said sample being non-random.

5. The method of claim 1, said group fail rates varying between said groups.

6. The method of claim 1, said expected sample fail rate being different from an expected overall fail rate.

7. The method of claim 1, further comprising developing any of design changes and process changes when said actual sample fail rate is greater than said expected sample fail rate.

8. The method of claim 1, further comprising allowing for incorporation of said integrated circuit chips into products when said actual sample fail rate is less than or equal to said expected sample fail rate.

9. A method comprising:
    sorting integrated circuit chips manufactured according to a design into groups of integrated circuit chips, said groups corresponding to different process windows within a process distribution for said design; and, performing reliability qualification of said integrated circuit chips, said performing of said reliability qualification comprising:

setting pass/fail criteria for said integrated circuit chips;

given said pass/fail criteria, determining group fail rates for said groups;

determining an expected overall fail rate for said integrated circuit chips, said expected overall fail rate being based on said group fail rates;

selecting a sample of said integrated circuit chips from at least one of said groups;

identifying all specific groups from which said sample was selected;

determining percentages of said sample selected from said specific groups and specific group fail rates for said specific groups;

determining an expected sample fail rate for said sample, said expected sample fail rate being determined considering said percentages and said specific group fail rates and being different from said expected overall fail rate;

stress testing said sample to determine an actual sample fail rate for said sample, given said pass/fail criteria, said pass/fail criteria comprising pass or fail criteria indicating any of required functional responses for passing said stress testing and required parametric measurements required for passing said stress testing; and, comparing said expected sample fail rate to said actual sample fail rate.

10. The method of claim 9, further comprising: for each integrated circuit chip in each group, determining failure mechanism fail rates for different failure mechanisms on said integrated circuit chip as a function of a process window associated with said group and determining a chip fail rate based on said failure mechanism fail rates, each group fail rate being determined based on chip fail rates for any of said integrated circuit chips in said group.

11. The method of claim 9, said sample being selected from less than all of said groups.

12. The method of claim 9, said sample being non-random.

13. The method of claim 9, said group fail rates varying between said groups.

14. The method of claim 9, further comprising developing any of design changes and process changes when said actual sample fail rate is greater than said expected sample fail rate.

15. The method of claim 9, further comprising allowing for incorporation of said integrated circuit chips into products when said actual sample fail rate is less than or equal to said expected sample fail rate.

16. A method comprising:

sorting integrated circuit chips manufactured according to a design into groups of integrated circuit chips, said groups corresponding to different process windows within a process distribution for said design; and, performing reliability qualification of said integrated circuit chips, said performing of said reliability qualification comprising:

setting pass/fail criteria for said integrated circuit chips;

given said pass/fail criteria, determining group fail rates for said groups;

determining an expected overall fail rate for said integrated circuit chips, said expected overall fail rate being based on said group fail rates;

selecting a sample of said integrated circuit chips from at least one of said groups;

identifying all specific groups from which said sample was selected;

determining percentages of said sample selected from said specific groups and specific group fail rates for said specific groups;

determining an expected sample fail rate for said sample, said expected sample fail rate being calculated as a sum of fail rate contributions from said specific groups, each fail rate contribution of each specific group comprising a product of a specific group fail rate determined for said specific group multiplied by a percentage of said sample selected from said specific group;

stress testing said sample to determine an actual sample fail rate for said sample, given said pass/fail criteria, said pass/fail criteria comprising pass or fail criteria indicating any of required functional responses for passing said stress testing and required parametric measurements required for passing said stress testing; and, comparing said expected sample fail rate to said actual sample fail rate.

17. The method of claim 16, further comprising: for each integrated circuit chip in each group, determining failure mechanism fail rates for different failure mechanisms on said integrated circuit chip as a function of a process window associated with said group and determining a chip fail rate based on said failure mechanism fail rates, each group fail rate being determined based on chip fail rates for any of said integrated circuit chips in said group.

18. The method of claim 16, said sample being selected from less than all of said groups.

19. The method of claim 16, said group fail rates varying between said groups.

20. The method of claim 16, further comprising:

developing any of design changes and process changes when said actual sample fail rate is greater than said expected sample fail rate; and, allowing for incorporation of said integrated circuit chips into products when said actual sample fail rate is less than or equal to said expected sample fail rate.

* * * * *